United States Patent
Blanken et al.

(10) Patent No.: US 9,065,429 B2
(45) Date of Patent: Jun. 23, 2015

(54) SEMICONDUCTOR SWITCH WITH RELIABLE BLACKOUT BEHAVIOR AND LOW CONTROL POWER

(75) Inventors: Pieter Gerrit Blanken, Nuenen (NL); Peter Luerkens, Aachen (DE); Matthias Wendt, Würselen (DE); Carsten Deppe, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/111,836

(22) PCT Filed: Apr. 10, 2012

(86) PCT No.: PCT/IB2012/051741
§ 371 (c)(1),
(2), (4) Date: Oct. 15, 2013

(87) PCT Pub. No.: WO2012/143815
PCT Pub. Date: Oct. 26, 2012

(65) Prior Publication Data
US 2014/0049301 A1 Feb. 20, 2014

(30) Foreign Application Priority Data
Apr. 18, 2011 (EP) .................................. 11162774

(51) Int. Cl.
*H03L 7/00* (2006.01)
*H03K 3/012* (2006.01)
*H03K 17/687* (2006.01)
*H03K 17/691* (2006.01)

(52) U.S. Cl.
CPC ............. *H03K 3/012* (2013.01); *H03K 17/6874* (2013.01); *H03K 17/691* (2013.01); *H03K 2217/0081* (2013.01)

(58) Field of Classification Search
CPC ............ H03K 17/6874; H03K 17/691; H03K 2217/0081
USPC .................................. 327/143, 369, 372, 427
See application file for complete search history.

(56) References Cited

U.S. PATENT DOCUMENTS

| | | | |
|---|---|---|---|
| 4,170,740 A | 10/1979 | Pernyeszi | |
| 5,237,211 A | 8/1993 | Tanaka et al. | |
| 5,349,242 A | 9/1994 | Tanaka et al. | |
| 6,208,126 B1 | 3/2001 | Gonthier | |
| 6,288,603 B1 * | 9/2001 | Zanuccoli et al. | ............ 327/544 |
| 6,603,221 B1 | 8/2003 | Liu | |

(Continued)

FOREIGN PATENT DOCUMENTS

| | | |
|---|---|---|
| EP | 1326339 A2 | 7/2003 |
| WO | 2010084444 A2 | 7/2010 |
| WO | 2010146433 A1 | 12/2010 |

*Primary Examiner* — Hai L Nguyen
(74) *Attorney, Agent, or Firm* — Yuliya Mathis

(57) ABSTRACT

The present invention relates to a bidirectional semiconductor switch (M1, M2) with extremely low control power consumption and a bootstrap circuit which allows reliable start of operation of the switch and the hosting device after unlimited duration of mains interruptions. Intelligent control options are provided by operating from a small energy storage and no extra means are required to recover from a depleted energy storage condition. The absence of audible noise and mechanical wear also enables more frequent recharging cycles and allows smaller and thus cheaper energy storage components.

12 Claims, 3 Drawing Sheets

(56) References Cited

U.S. PATENT DOCUMENTS

| | | | |
|---|---|---|---|
| 7,595,680 B2 * | 9/2009 | Morita et al. | 327/427 |
| 8,582,263 B2 * | 11/2013 | Butler | 361/91.1 |
| 2001/0046143 A1 | 11/2001 | Bruckmann et al. | |
| 2010/0070103 A1 | 3/2010 | Fleck et al. | |

* cited by examiner

SEMICONDUCTOR SWITCH WITH RELIABLE BLACKOUT BEHAVIOR AND LOW CONTROL POWER

FIELD OF THE INVENTION

The present invention relates to a switching apparatus for connecting and disconnecting appliances and devices to a power grid.

BACKGROUND OF THE INVENTION

Standby power consumption reduction is becoming a major issue for appliances and devices, supplied from the utility grid, such as consumer lifestyle appliances or networked lighting ballasts. In the past, solutions have been proposed, which solved the above problem by using a very-low-power controller circuit in combination with an energy storage element and a bi-stable or latching relay. Major disadvantages of the relay are the audible switching noise, the limited lifetime, the large physical size, limited reliability under mechanical shocks, and eventually high cost. Audible noise and mechanical wear during switching mandates avoiding frequent recharging of the energy storage and thus demands for a substantial capacity of the storage element, leading to higher cost. Return of the mains voltage after a blackout leads to synchronous inrush current of all connected devices which may trip circuit breakers and thus may lead to another blackout.

A simple replacement of the mechanical relay by a semiconductor switch has the disadvantages of risking dead-lock situations after mains blackout and depletion of the energy storage element in consequence. There is also a constant effort keeping it into a desired state, compared to the latching or bi-stable relay solution.

SUMMARY OF THE INVENTION

It is an object of the present invention to provide a switching apparatus with extremely low control power consumption, which allows reliable start of operation of the switching apparatus and the hosting device after unlimited duration of mains interruptions.

This object is achieved by an apparatus, according to various embodiments described herein.

Accordingly, a bidirectional semiconductor switch is proposed with extremely low control power consumption and an ultra low power bias supply circuit which allows reliable start of operation of the switch and the hosting device after unlimited duration of mains interruptions. This allows hosting applications to operate in standby conditions without electrical connection to the mains at all, and offer intelligent control options just operating from a small energy storage and does not require extra means anymore to recover from a depleted energy storage condition. The absence of audible noise and mechanical wear also enables more frequent recharging cycles and allows smaller and thus cheaper energy storage components.

According to a first aspect, an additional randomizer can be provided which delays the operation of the switching apparatus after a mains interruption in a random way (e.g. between zero and an acceptable maximum time delay) and thus enforces an asynchronous behaviour of the connected devices, avoiding repeated tripping of the circuit breakers.

According to a second aspect which can be combined with said first aspect, the semiconductor switch may comprise at least two metal oxide semiconductor field effect transistors or at least two insulated gate bipolar transistors. Thus, it can be ensured that control power of the semiconductor switch is minimized.

According to a third aspect which can be combined with said first or second aspect, the bias supply circuit may comprise a serial connection of the at least one capacitor and a zener diode adapted to limit the supply voltage derived from the power grid, and a diode for rectifying the limited supply voltage to obtain the floating auxiliary voltage. Thereby, discharge resistor(s) across the at least one capacitor can be omitted, which helps to reduce power consumption.

According to a fourth aspect which can be combined with at least one of the first to third aspects, a buffer capacitor may be provided for buffering the floating auxiliary voltage. This measure ensures that supply voltage of the switching control circuit is buffered for a certain duration.

According to a fifth aspect which can be combined with at least one of the first to fourth aspects, the switching control circuit may comprise a latch circuit (such as for example a flip flop or other bistable realization) and wherein the isolation circuit comprises an isolating signal transformer or optical coupler for supplying the at least one control signal to a signal processing circuit for generating control commands to be supplied to the latch circuit.

According to a sixth aspect which can be combined with at least one of the first to fifth aspects, a watchdog circuit may be provided, which is adapted to sense the floating auxiliary voltage and to provide a control signal to the latch circuit if the floating auxiliary voltage is below a predetermined threshold, wherein the control signal triggers a dominant reset of the semiconductor switch. Thereby, damage to the semiconductor switch due to excessive power dissipation can be prevented. As an additional option, another watchdog circuit may be provided, which is adapted to determine the status (e.g. energy level) of at least some energy storage elements in the apparatus, and of which the output signal may also provide a control signal to the latch circuit to initiate a turn-on cycle with subsequent recharging of fore-mentioned energy storing elements of the apparatus. According to a seventh aspect which can be combined with at least one of the first to sixth aspects, wherein the watchdog circuit may comprise a transistor activated by the floating auxiliary voltage as soon as said auxiliary voltage has reached its nominal value, and wherein a collector voltage of the transistor is supplied to an input terminal of the latch circuit. Thereby, a simple supply voltage detection and watchdog functionality can be implemented.

BRIEF DESCRIPTION OF THE DRAWINGS

These and other aspects of the invention will be apparent from and elucidated with reference to the embodiment(s) described hereinafter. In the following drawings.

DETAILED DESCRIPTION OF EMBODIMENTS

The following embodiments are based on a switching apparatus with bidirectional semiconductor switch with extremely low control power consumption and an ultra low power bias supply circuit which allows reliable start of operation of the switch and the hosting device after unlimited duration of mains interruptions.

Figure 1:
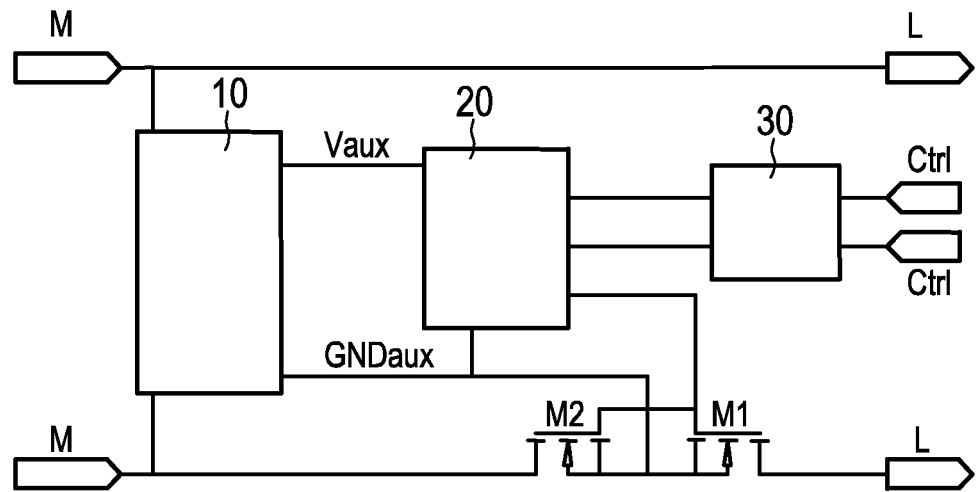
FIG. 1 shows a schematic block diagram of a switching apparatus according to the embodiments.

FIG. 1 shows a schematic block diagram with the basic components of a switching apparatus according to the following embodiments of the present invention. Power transistors (e.g. N-MOSFETs (Metal Oxide Semiconductor Field Effect Transistors) or IGBTs (Insulated Gate Bipolar Transistor)) M1 and M2 form a bidirectional mains switch. A control voltage referenced to the common source GNDaux of the MOSFETs is generated by a switching control circuit or On/Off controller 20. The On/Off controller 20 is supplied by an ultra low power bias supply 10, which can be designed for very low power consumption, e.g., less then 1 mW. Activation of the switch is done by the On/Off controller 20, which takes care about turning the switch on or off after mains failure and on request of control signals Ctrl supplied via a signal isolation block 30. The signal isolation block 30 serves to isolate the switching apparatus from a control circuit (not shown) which supplies the control signals Ctrl and may include one or more opto-couplers or an inductive link, such as an isolation transformer.

A MOSFET is a transistor where a voltage on an oxide-insulated gate electrode can induce a conducting channel between the two other contacts called source and drain. The channel can be of n-type or p-type, and the transistor is accordingly called an N-MOSFET or a P-MOSFET.

The MOSFETS of FIG. 1 may be replaced by insulated gate bipolar transistors (IGBTs), which are three-terminal power semiconductor devices for high efficiency and fast switching. The IGBT combines the simple gate-drive characteristics of the MOSFETs with the high-current and low-saturation-voltage capability of bipolar transistors by combining an isolated gate FET for the control input, and a bipolar power transistor as a switch, in a single device.

An N-MOSFET or an IGBT need a significantly positive charge applied to the gate in order to turn on. Using N-MOSFET/IGBT devices is a common cost reduction method due largely to die size reduction (there are other benefits as well).

Figure 2:
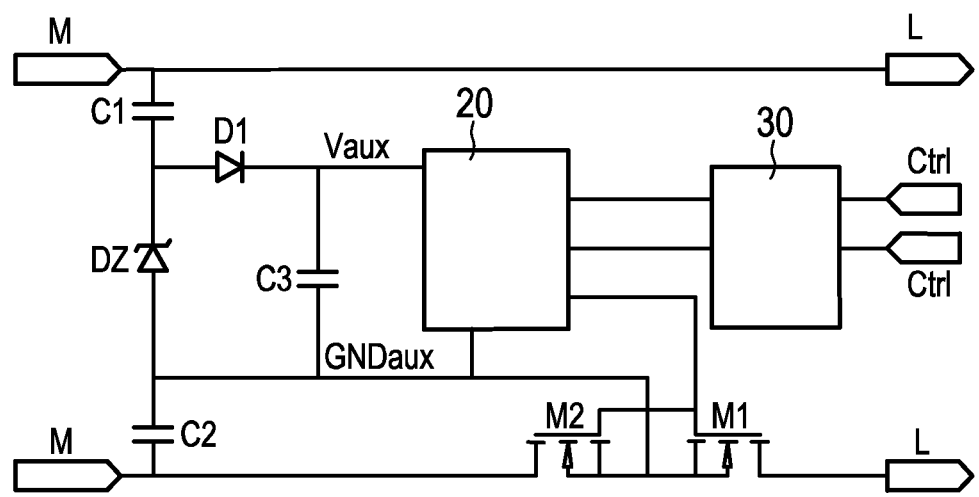
FIG. 2 shows a more detailed block diagram of a switching apparatus according to a first embodiment.

A MOSFET/IGBT is a voltage controlled device which, in theory, will not have any direct gate current. This makes it possible to utilize the charge inside the capacitor for control purposes. However, eventually the capacitor will lose its charge (due to parasitic gate current and non ideal (i.e. infinite) internal resistance), FIG. 2 shows a schematic block diagram of a first embodiment of the switching apparatus with a more detailed implementation of the ultra low power bias supply 10. A floating auxiliary voltage between nodes Vaux and GNDaux is generated from the mains voltage by use of two small capacitors C1 and C2, limited by zener diode DZ and rectified by diode D1. The floating auxiliary voltage is buffered by a capacitor C3. The values of the capacitors C1 and C2 can for instance be a few nano-farad (nF) at typical AC mains voltages of 115V at 60 Hz or 230V at 50 Hz. These capacitor values are so low that discharge resistors, parallel to the capacitors C1 respectively C2, are not required, which helps to reduce power consumption.

The values of the capacitors C1 and C2 need not be equal. In the best optimized case the power consumption of the On/Off controller 20 becomes such low that the capacitors C1 and C2 can be chosen in a range below 100 pF. In this case, the capacitor C2 could even be omitted.

It is noted that in the ultra low power bias supply used in the embodiments there are no requirements to the duty cycle of the bidirectional switch formed by the power transistors M1 and M2. The capacitive supply (with C1, C2 and DZ, D1) recharges storage capacitor C3 as long as the AC mains voltage is present between terminals M, independent of the state of the bidirectional switch.

Figure 3:
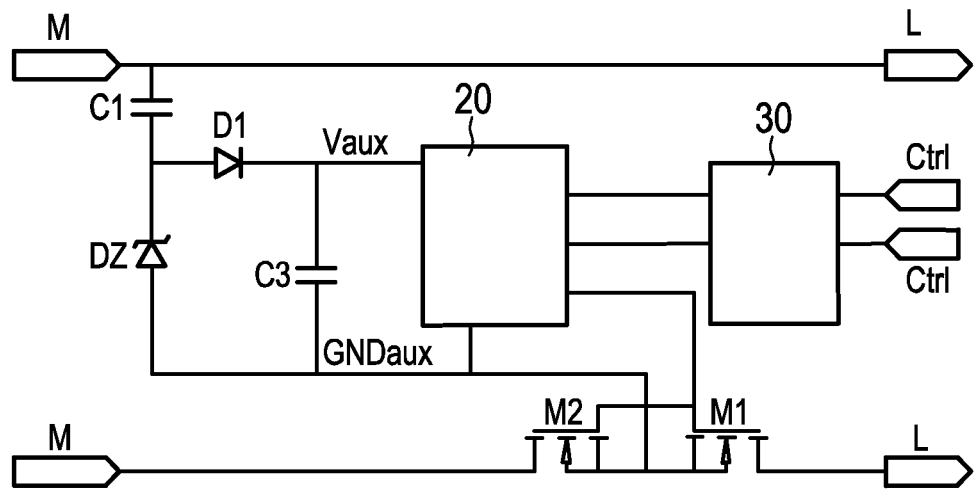
FIG. 3 shows a more detailed block diagram of a switching apparatus according to a second embodiment.

FIG. 3 shows a schematic block diagram of a second embodiment of the switching apparatus with more detailed implementation of the bias supply 10, where the capacitor C2 has been removed in view of the fact that the MOSFETs M2 and M1 of the mains switch provide some amount of parasitic capacitance also (not shown).

Figure 4:
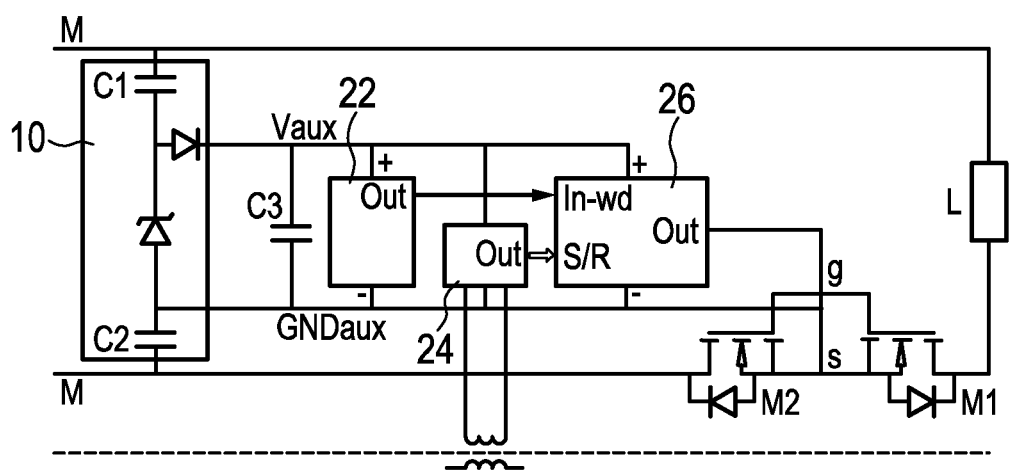
FIG. 4 shows a more detailed block diagram of a switching apparatus according to a third embodiment.

FIG. 4 shows a schematic block diagram of a third embodiment of the switching apparatus with a more detailed implementation of the bias supply 10, the On/Off controller 20 and the signal isolation block 30. The On/Off control controller 20 is provided with a signal processing circuit 24 that extracts set (S) and reset (R) commands from short signal pulses, e.g., control signals CTRL that are transmitted from a control circuit (not shown), e.g., a DALI (digital addressable lighting interface), DMX (digital multiplexing) or other control system including an isolation transformer. The signal processing functionality in block 24 suppresses common-mode events e.g. due to capacitive coupling in the isolation transformer and provides signal rejection to disturbances, transients, surges, etc. The isolation transformer may resemble the ones used in ISDN (Integrated Services Digital Network) applications. The signalling chain may also be implemented by an optocoupler (a photo-transistor and a photodiode in active mode) (not shown) or more than one optocoupler.

The extracted pulses are used to set or reset a bi-stable latch circuit (e.g. 1-bit flip-flop with output drivers) which is incorporated in a signal processing block 26 which provides the gate control signal to the power transistors M1 and M2. As already mentioned above, this kind of transistors has (aside from leakage) negligible energy consumption in the gate-source input port to maintain a switching state. Energy is dissipated in the signal processing block 26 only during turn-on or turn off. As such, there is substantially no or negligible control energy consumption during steady state operation.

A further element is a watchdog circuit 22, which constantly senses the differential voltage between the Vaux and GNDaux nodes and outputs a signal to the signal processing block 26. The output signal of the watchdog circuit 22 changes state when the differential voltage crosses a predetermined level. The watchdog output signal is thus continuously present, indicating whether the differential floating voltage is above or below the threshold value. Whether a turn-on cycle with subsequent recharging of the energy storage elements of the hosting device is necessary is not dependent on the output signal of the described watchdog circuit 22, but may be initiated by a separate watchdog circuit in the hosting device, monitoring the energy level of at least some of the energy storage elements in the hosting device. Thus, the other watchdog circuit is adapted to determine a status of the at least some energy storage elements and to provide another control signal to the latch circuit 26 if an energy level of the energy storage elements is below a predetermined threshold. The control signal may then trigger a turn-on cycle of the power transistors M1, and M2 with subsequent recharging of the at least some energy storage elements.

The purpose of the watchdog circuit 22 is to guarantee that the power transistors M1 and M2 are never conductive (dominant reset) when the differential voltage between the Vaux and GNDaux nodes is not sufficiently high, to prevent brown-out of the power transistors M1 and M2, due to excessive power dissipation. A separate watchdog circuit (not shown) may be added in the hosting device, monitoring the energy of the energy storage elements in the hosting device. Its purpose is to have the system recover from a situation where the energy storage is completely exhausted. This allows the application to execute a provisional turn-on cycle automatically and a subsequent period of recharging the energy storage elements (including those in the control unit). The turn-on-cycle is provisional in that sense that normal operation of the appliance (i.e. load L in FIG. 4) is not entered unless an appropriate control signal is received and the appliance will be disconnected from mains again, if the energy storage elements are recharged again.

Figure 5:
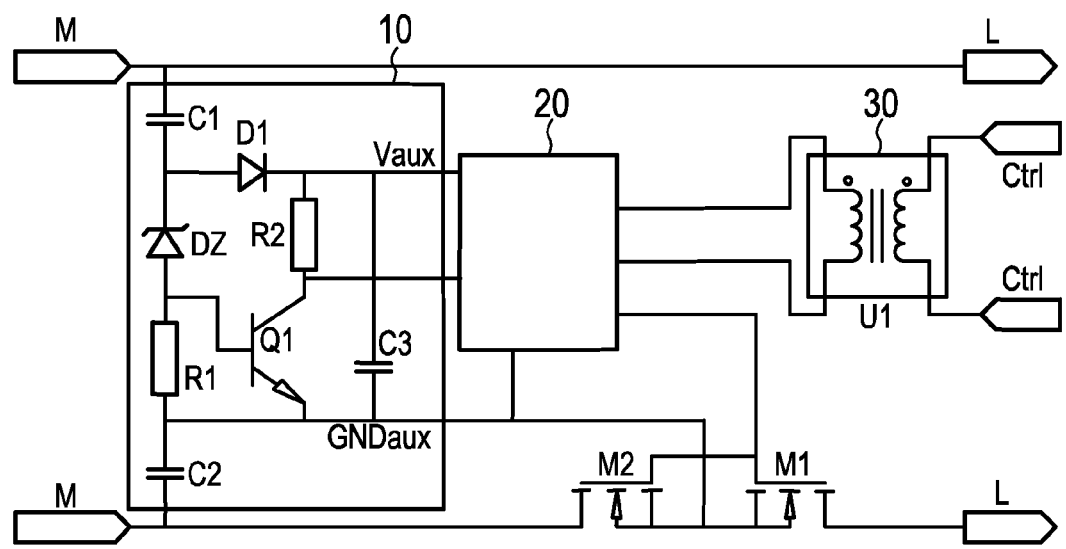
FIG. 5 shows a more detailed diagram of a switching apparatus according to a fourth embodiment.

FIG. 5 shows a schematic block diagram of a fourth embodiment of the switching apparatus in which the ultra low power bias supply 10 comprises a simple ultra-low-power bias supply generation and auxiliary supply voltage detection (watchdog functionality) with resistors R1 and R2, and a transistor Q1 without adding a further voltage reference (which saves static energy consumption). R1 could be omitted, if the base of the transistor Q1 can stand the current through the zener diode DZ. As soon as the capacitor C3 is charged to the normal operation voltage, some current starts flowing through the zener diode DZ in the positive direction, which activates the transistor Q1. The collector voltage of the transistor Q1 is the output signal of the watchdog circuit and forms an input signal to the On/Off controller 20. This circuit can be extended by adding a hysteresis function, e.g., through a feedback circuit or element (not shown). As shown in FIG. 5, the signal isolation block 30 comprises an isolation transformer U1 for achieving the required isolation between switching and control circuits.

Another way to implement the watchdog functionality is to use a commercially-available integrated circuit (IC). Such a commercially-available IC might be a micro-power low-voltage comparator, such as Linear Technology LT6703, which can be connected as a watchdog circuit. Although its current consumption in normal operation (e.g. supply voltage above 1.4V) is reasonably low (e.g. below 10 µA), during start-up (e.g. supply voltage below 1V) the IC draws a supply current with a value exceeding 30 µA. To guarantee that the auxiliary voltage supply supplies sufficient current, in that case the values of the capacitors C1 and C2 need to be chosen higher, e.g. 3.3 nF, each at a typical root mean square (RMS) mains voltage of 230V at 50 Hz. Furthermore, a signal-processing electronics may be connected to the secondary side of the isolation transformer. More specifically, digital building blocks of CMOS IC's may be used.

In another modification of the above embodiments, an input circuit for inputting an on/off input signal, e.g. as generated by a DALI or DMX decoder interface, may be provided, which includes a circuit built with CMOS logic cells, so as to convert the on/off input signal into short on/off pulses that are fed to the primary-side terminals of the isolation transformer. The input circuit can be supplied e.g. with 10V DC, and may consume less than 1 µA at an on/off switch frequency of less than once per second.

An additional feature can be a randomizing function or randomizer which delays the turn-on of the power transistors M1 and M2 after a mains interruption and depletion of the storage elements in order to prevent synchronous inrush currents in all devices in a circuit branch and in response tripping circuit breakers, which might lead to another blackout situation. This would be particularly useful in large lighting installations with many ballast circuits and large buffer capacity in the power supplies.

The invention can be applied for instance in appliances offering remote control of appliances and having extended standby periods while still being responsive to remote control commands. This includes remotely controlled lighting systems, e.g. by means of DALI, ZigBee, DMX or other lighting or building control solutions, as well as consumer lifestyle appliances, such as television (TV) sets, set-top-boxes, household appliances, or consumer lighting solutions.

In summary, a bidirectional semiconductor switch with extremely low control power consumption and an ultra low power bias supply circuit has been described, which allows reliable start of operation of the switch and the hosting device after unlimited duration of mains interruptions. Intelligent control options are provided by operating from a small energy storage and no extra means are required to recover from a depleted energy storage condition. The absence of audible noise and mechanical wear also enables more frequent recharging cycles of energy storage elements in the hosting device and allows smaller and thus cheaper energy storage components.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single processor, sensing unit or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope thereof.

The invention claimed is:

1. A switching apparatus for connecting/disconnecting electrical devices to/from a power grid in response to mains interruptions, the apparatus coupled to the power grid via at least one input terminal, the apparatus comprising:
a bidirectional semiconductor switch;
an isolation circuit for isolating the apparatus from a control circuit;
a bias supply for generating a floating auxiliary voltage using at least one capacitor; and
an On/Off controller powered by the floating auxiliary voltage, wherein the On/Off controller is configured to output a control voltage received by the bidirectional semiconductor switch, turning on the bidirectional semiconductor switch, in response to an appearance of a supply voltage derived from the mains and supplied via the bias supply circuit.

2. The apparatus according to claim 1, further comprising a randomizer which delays an operation of the bidirectional semiconductor switch in response to an interruption of the supply voltage.

3. The apparatus according to claFim 1, wherein the bidirectional semiconductor switch comprises at least two metal oxide semiconductor field effect transistors or at least two insulated gate bipolar transistors.

4. The apparatus according to claim 1, wherein the bias supply comprises a serial connection of the at least one capacitor and a zener diode adapted to limit the supply voltage derived from the power grid, and a diode for rectifying the limited supply voltage to obtain the floating auxiliary voltage.

5. The apparatus according to claim 4, further comprising a buffer capacitor for buffering the floating auxiliary voltage.

6. The apparatus according to claim 5, wherein a capacitive supply of the at least one capacitor recharges the buffer capacitor as long as voltage from the power grid is present, independent of a state of the bidirectional semiconductor switch.

7. The apparatus according to claim 1, wherein the On/Off controller is further configured to output the control voltage to the bidirectional semiconductor switch in response to at least one control signal supplied via the isolation circuit from a control circuit.

8. The apparatus according to claim 7, wherein the On/Off controller comprises a latch circuit and wherein the isolation circuit comprises an isolation transformer or optical coupler for supplying the at least one control signal to a signal processing circuit of the On/Off controller for generating control commands to be supplied to the latch circuit.

9. The apparatus according to claim 8, wherein the latch circuit comprises a bi-stable flip-flop.

10. The apparatus according to claim 8, further comprising a watchdog circuit adapted to sense the floating auxiliary voltage and to provide a watchdog control signal to the latch circuit when the floating auxiliary voltage is below a predetermined threshold, wherein the watchdog control signal triggers a dominant reset of the bidirectional semiconductor switch.

11. The apparatus according to claim 10, further comprising another watchdog circuit adapted to determine an energy of energy storage elements in the apparatus and to provide another watchdog control signal to the latch circuit when the energy level of the energy storage elements is below a predetermined threshold, where the another watchdog control signal triggers a turn-on cycle of the bidirectional semiconductor switch with subsequent recharging of energy storage elements of the apparatus.

12. The apparatus according to claim 10, wherein the watchdog circuit comprises a transistor activated by the auxiliary voltage as soon as the auxiliary voltage has reached its nominal value, wherein the transistor is coupled such that it is activated by current flowing through the zener diode, and wherein a collector voltage of the transistor is an output signal of the watchdog circuit supplied to an input terminal of the latch circuit.

\* \* \* \* \*